(12) United States Patent
Lanois

(10) Patent No.: US 7,101,739 B2
(45) Date of Patent: Sep. 5, 2006

(54) METHOD FOR FORMING A SCHOTTKY DIODE ON A SILICON CARBIDE SUBSTRATE

(75) Inventor: Frédéric Lanois, Tours (FR)

(73) Assignee: STMicroelectronics S.A., Montrouge (FR)

( * ) Notice: Subject to any disclaimer, the term of this patent is extended or adjusted under 35 U.S.C. 154(b) by 468 days.

(21) Appl. No.: 10/300,208

(22) Filed: Nov. 20, 2002

(65) Prior Publication Data

US 2003/0096464 A1 May 22, 2003

(30) Foreign Application Priority Data

Nov. 21, 2001 (FR) .............................. 01 15026

(51) Int. Cl.
*H01L 21/20* (2006.01)
*H01L 21/00* (2006.01)

(52) U.S. Cl. ........................ 438/141; 438/90; 438/92; 438/531

(58) Field of Classification Search ............. 438/527, 438/109, 134, 209, 350, 658, 323, 353; 257/486, 257/481, 485, 490, 52

See application file for complete search history.

(56) References Cited

U.S. PATENT DOCUMENTS

| | | | | |
|---|---|---|---|---|
| 4,149,174 A | * | 4/1979 | Shannon | 257/29 |
| 4,310,362 A | * | 1/1982 | Roche et al. | 438/476 |
| 4,638,551 A | * | 1/1987 | Einthoven | 438/530 |
| 4,648,174 A | * | 3/1987 | Temple et al. | 438/514 |
| 4,871,686 A | * | 10/1989 | Davies | 438/328 |
| 4,874,714 A | * | 10/1989 | Eklund | 438/200 |
| 5,204,541 A | * | 4/1993 | Smayling et al. | 257/138 |
| 5,225,359 A | * | 7/1993 | DeLong | 438/328 |
| 5,286,660 A | * | 2/1994 | Chiou et al. | 438/535 |
| 5,614,755 A | * | 3/1997 | Hutter et al. | 257/471 |
| 5,728,593 A | * | 3/1998 | Yun et al. | 438/141 |
| 5,789,311 A | | 8/1998 | Ueno et al. | |
| 5,914,500 A | * | 6/1999 | Bakowski et al. | 257/77 |
| 5,920,096 A | * | 7/1999 | Lee | 257/355 |
| 5,994,720 A | * | 11/1999 | Snyman et al. | 257/86 |
| 6,031,254 A | | 2/2000 | Quoirin | |
| 6,075,259 A | * | 6/2000 | Baliga | 257/77 |
| 6,096,618 A | * | 8/2000 | Dunn et al. | 438/328 |
| 6,111,271 A | * | 8/2000 | Snyman et al. | 257/80 |
| 6,423,986 B1 | * | 7/2002 | Zhao | 257/138 |
| 6,429,501 B1 | * | 8/2002 | Tsuchitani et al. | 257/493 |
| 6,448,160 B1 | * | 9/2002 | Chang et al. | 438/527 |
| 6,482,704 B1 | * | 11/2002 | Amano et al. | 438/285 |
| 6,498,367 B1 | * | 12/2002 | Chang et al. | 257/341 |
| 6,501,145 B1 | * | 12/2002 | Kaminski et al. | 257/471 |
| 6,525,389 B1 | * | 2/2003 | Ahmed | 257/486 |
| 6,576,973 B1 | * | 6/2003 | Collard et al. | 257/483 |
| 6,710,419 B1 | * | 3/2004 | Buchanan et al. | 257/475 |
| 2001/0054715 A1 | | 12/2001 | Collard et al. | |
| 2002/0020893 A1 | | 2/2002 | Lhorte | |

FOREIGN PATENT DOCUMENTS

JP      2001 085704 A      3/2001

OTHER PUBLICATIONS

French Search Report from French Patent Application No. 01/15026, filed Nov. 21, 2001.

* cited by examiner

*Primary Examiner*—Michael Lebentritt
(74) *Attorney, Agent, or Firm*—Lisa K. Jorgenson; James H. Morris; Wolf, Greenfield & Sacks, P.C.

(57) ABSTRACT

A method for manufacturing a vertical Schottky diode with a guard ring on a lightly-doped N-type silicon carbide layer, including forming a P-type epitaxial layer on the N-type layer; implanting N-type dopants in areas of the P-type epitaxial layer to neutralize in these areas, across the entire thickness of the epitaxial layer, the P-type dopants to form N-type regions, of dopant concentration lower than that of the epitaxial layer, and delimiting a P-type guard ring; forming on the external periphery of the component an insulating layer partially covering the guard ring; and forming a Schottky contact with the N-type region internal to the guard ring.

18 Claims, 5 Drawing Sheets

METHOD FOR FORMING A SCHOTTKY DIODE ON A SILICON CARBIDE SUBSTRATE

BACKGROUND OF THE INVENTION

1. Field of the Invention

The present invention relates to a method for manufacturing a Schottky diode on a silicon carbide substrate.

2. Discussion of the Related Art

In the field of semiconductor components, the material mainly used currently is silicon. To have very high breakdown voltages, silicon carbide is preferable since silicon carbide can stand voltages per thickness unit approximately 10 times higher than silicon.

However, in the present state of the art, currently-used manufacturing processes to form silicon-based components cannot be transposed to form silicon carbide (SiC) based components. In particular, it is currently not possible, in practice, to perform implantations and diffusions of P-type dopants in N-type doped silicon carbide, noting that the P-type dopant currently used for silicon carbide is aluminum and the N-type dopant is nitrogen. Indeed, a diffusion anneal of an implantation of a P-type dopant would require temperatures on the order of 1700° C., which poses serious technological problems.

The elementary structure of a Schottky diode is illustrated in FIG. 1. This diode is formed from a heavily-doped N-type substrate 10 on which is formed an N-type epitaxial layer 11 properly doped to have the desired breakdown voltage. On this epitaxial layer N is deposited silicon oxide 12 delimiting a window in which the Schottky contact is desired to be established by means of an appropriate metallization 13. The rear surface of the component is coated with a metallization 14.

Such a structure has a very poor breakdown voltage. Indeed, the equipotential surfaces tend to curve up to rise to the surface at the periphery of the contact area, which results, especially in the curvature areas of the equipotential surfaces, in very high values of the field which limit the possible reverse breakdown voltage. To avoid this disadvantage, the structure shown in FIG. 2, in which a peripheral P-type ring 15 is formed by implantation-diffusion at the periphery of the active area of the Schottky diode, is conventionally used for silicon-based components. As a result, the equipotential surfaces must pass in volume under the P regions and thus exhibit a smaller curvature. The dopant concentration of the P-type ring must be higher than that of the epitaxial layer to sufficiently push back the equipotential surfaces in this epitaxial layer. The breakdown voltage of the diode is thereby considerably improved. As an example, with an epitaxial layer of a doping level of $10^{16}$ at./cm$^3$, the breakdown voltage will be on the order of 10 V with no guard ring and on the order of 50 V with a guard ring.

However, as indicated previously, the forming of such a P-type guard ring is not easily implementable by implantation/diffusion in a structure formed on a silicon carbide substrate. In this case, the simple structure illustrated in FIG. 1 is not desirable either for the same reasons as in the case of a silicon substrate.

SUMMARY OF THE INVENTION

The present invention aims at providing a method for forming Schottky diodes with a relatively high breakdown voltage which can be simply implemented when the semiconductor is silicon carbide.

To achieve this and other objects, the present invention provides a method for manufacturing a vertical Schottky diode with a guard ring on a lightly-doped N-type silicon carbide layer, comprising the steps of: forming a P-type epitaxial layer on the N-type layer; implanting N-type dopants in areas of the P-type epitaxial layer to neutralize in these areas, across the entire thickness of the epitaxial layer, the P-type dopants to form N-type regions, of dopant concentration lower than that of the epitaxial layer, and delimiting a P-type guard ring; forming on the external periphery of the component an insulating layer partially covering the guard ring; and forming a Schottky contact with the N-type region internal to the guard ring.

According to an embodiment of the present invention, additional P-type regions located inside of guard ring are delimited upon implantation of N-type dopants.

According to an embodiment of the present invention, at least one additional ring located outside of the guard ring is delimited upon implantation of N dopants.

According to an embodiment of the present invention, the method further comprises the step of etching, prior to the implantation of N dopants, areas of the P-type epitaxial layer down to a depth smaller than the thickness of said epitaxial layer to form P-type protruding portions.

According to an embodiment of the present invention, the guard ring is delimited to comprise a protruding portion located on its outer periphery.

According to an embodiment of the present invention, the insulating layer covers the protruding portion of the guard ring.

According to an embodiment of the present invention, N-type dopants are implanted in a protruding portion of the P-type epitaxial layer down to a depth smaller than the thickness of said portion to form N-type regions located on P-type regions.

The foregoing objects, features and advantages of the present invention, will be discussed in detail in the following non-limiting description of specific embodiments in connection with the accompanying drawings.

DETAILED DESCRIPTION

As usual in the representation of semiconductors, in the different drawings, the various layers are drawn to scale neither in their horizontal dimension, nor in their vertical dimension.

Figure 1:
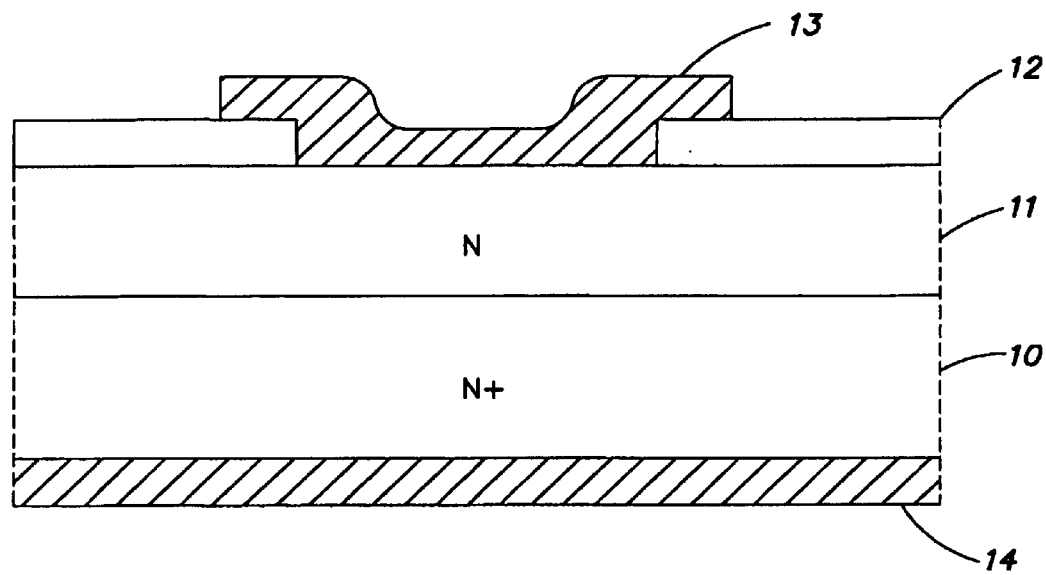
FIG. 1 is a simplified cross-section view of an elementary Schottky diode.
Figure 2:
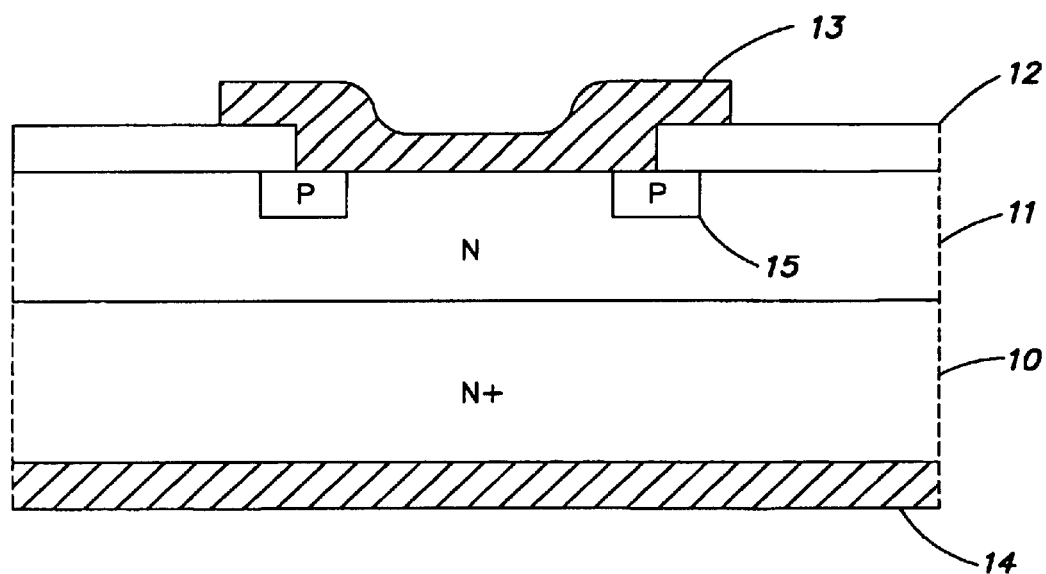
FIG. 2 is a simplified cross-section view of a conventional Schottky diode on a silicon substrate.
Figure 3A:
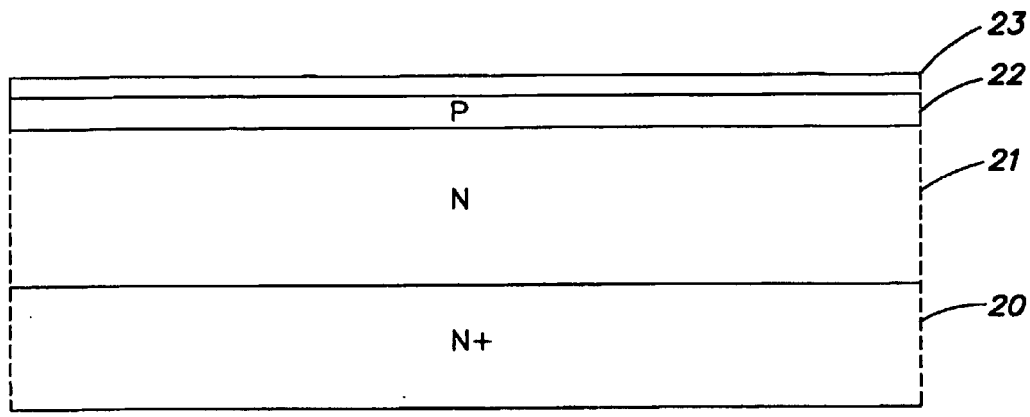
FIGS. 3A to 3E illustrate successive steps of the forming of a Schottky diode according to the present invention on a silicon carbide substrate.

As illustrated in FIG. 3A, a Schottky diode is formed on a heavily-doped N-type silicon carbide substrate 20 on which is grown a more lightly doped N-type epitaxial layer 21. On N-type epitaxial layer 21, a P-type epitaxial layer 22 more heavily-doped than this N-type epitaxial layer is grown. An insulating layer 23, for example, silicon oxide, covers P-type layer 22. As an example, P-type layer 22 has a thickness of 0.5 µm and a dopant concentration of approximately $3*10^{17}$ at./cm$^3$ and N-type layer 21 has a dopant concentration of approximately from $10^{15}$ to $2*10^{16}$ at./cm$^3$.

Figure 3B:
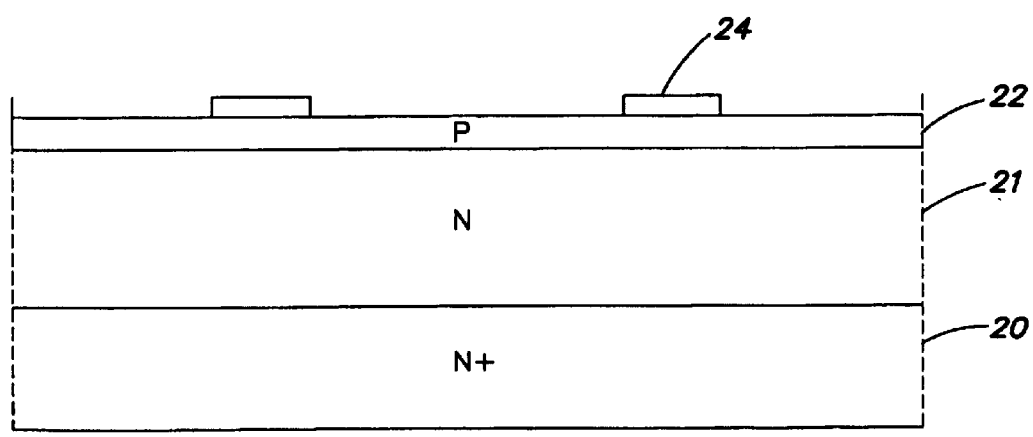

As shown in FIG. 3B, a mask 24 is formed in insulating layer 23. The mask patterns correspond to the imprints of the P-type regions which are desired to be delimited in epitaxial layer 22. Mask 24 may, for example, be ring-shaped.

Figure 3C:
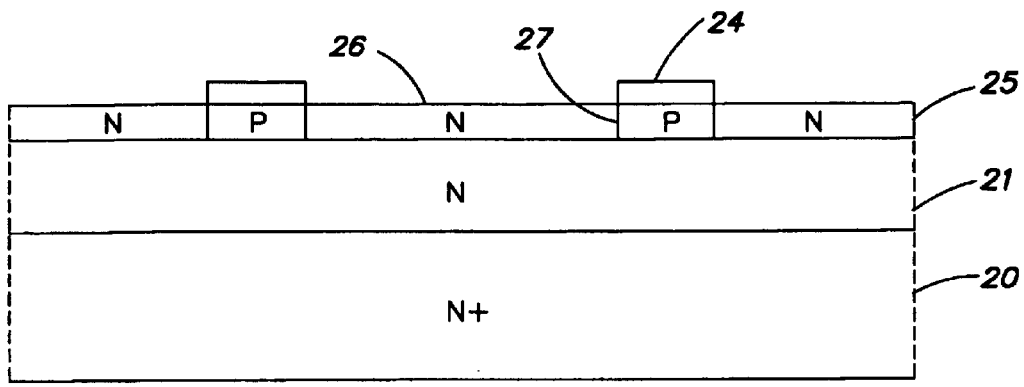

As illustrated in FIG. 3C, an implantation in P-type epitaxial layer 22 of N dopants, for example, nitrogen, is performed to neutralize the P dopants across the entire thickness of epitaxial layer 22 and form N-type lightly-doped regions which extend to N-type epitaxial layer 21. Lightly-doped N-type central and peripheral regions 25 and 26 are thus formed on either side of a P-type guard ring 27 corresponding to the portion of the epitaxial layer protected by mask 24. According to a feature of the present invention, the implantation of N-type dopants is such that the obtained N-type regions 25, 26 are more lightly-doped than P-type guard ring 27. As an example, the obtained lightly-doped N-type regions 25, 26 have a dopant concentration on the order of $10^{16}$ at./cm$^3$ of the same order of magnitude as the dopant concentration on underlying layer 21, while P-type guard ring 27 has a dopant concentration on the order of $10^{17}$ at./cm$^3$.

Figure 3D:
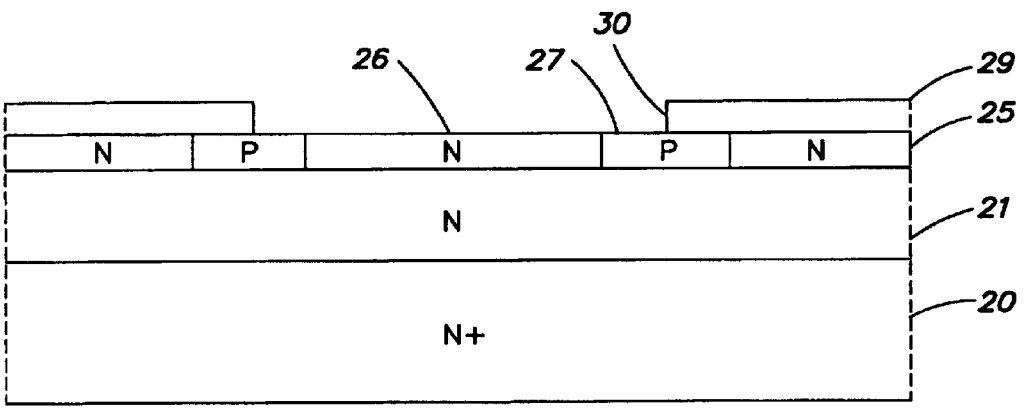

As illustrated in FIG. 3D, after removal of mask 24, the upper substrate surface is covered with an insulating layer 29, for example, silicon oxide, which delimits a window 30 at the level of which the Schottky diode is desired to be formed. Insulating layer 29 partially overlaps guard ring 27.

Figure 3E:
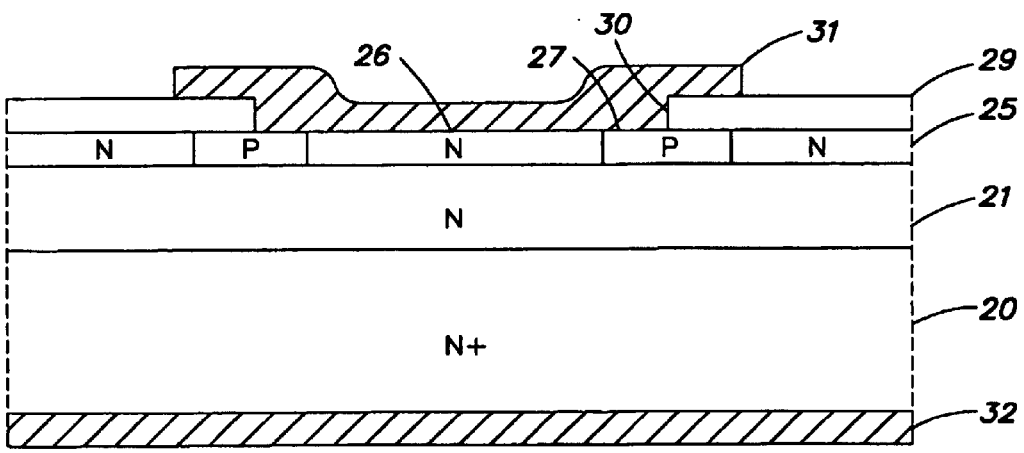

As illustrated on FIG. 3E, a Schottky contact layer 31, for example, a noble metal or a refractory metal silicide, is deposited at the level of window 30 of insulating layer 29. Layer 31 forms a Schottky contact with central N-type region 26, and biases P-type guard ring 27. A barrier layer (not shown) may be interposed between Schottky contact layer 31 and underlying N and P regions 26, 27.

A metallization 32 covers the lower surface of substrate 20. A vertical Schottky diode is thus obtained, formed on a silicon carbide substrate and comprising a guard ring structure adapted for a high breakdown voltage.

Figure 4A:
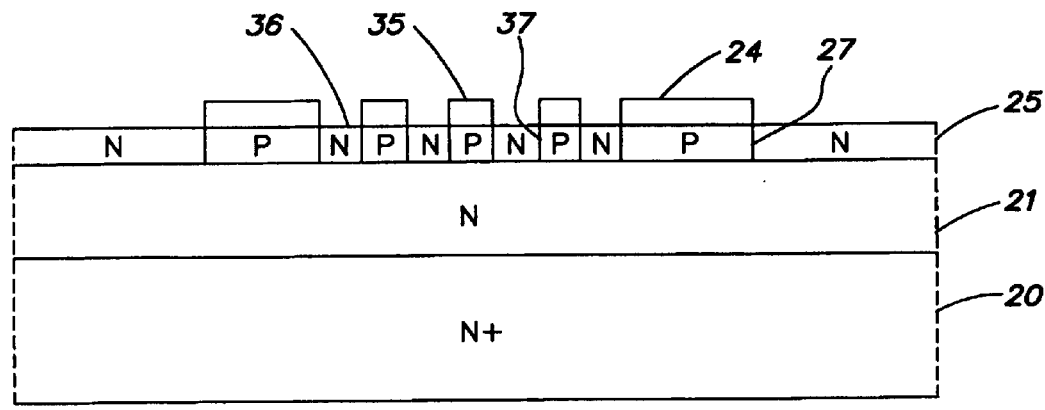
FIGS. 4A and 4B illustrate steps of the forming of an alternative Schottky diode on a silicon carbide substrate.
Figure 4B:
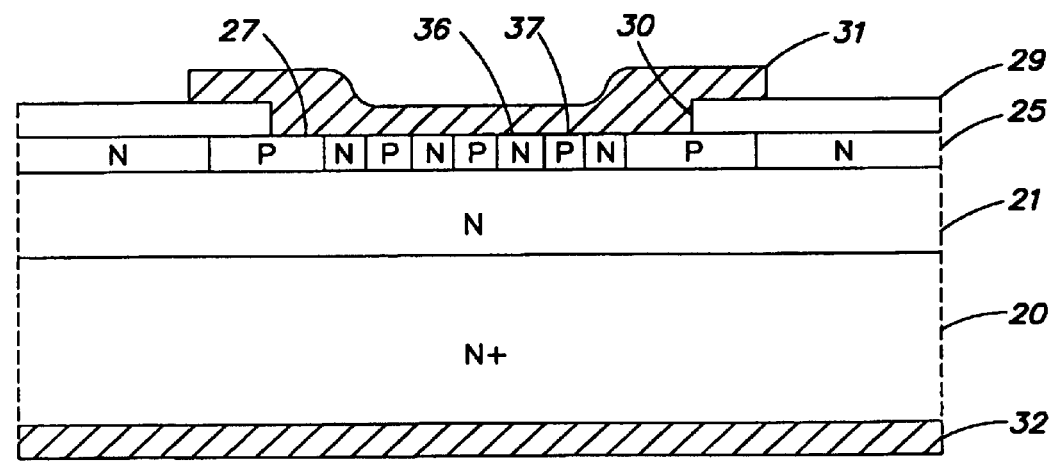

FIGS. 4A and 4B illustrate steps of a manufacturing method of an alternative Schottky diode.

FIG. 4A illustrates a step similar to that shown in FIG. 3B. As compared to the preceding embodiment, mask 24 comprises several additional masks 35 in addition to the ring pattern of FIG. 3B, so that, upon implantation of N dopants, lightly-doped N-type regions 25, 36 alternating with P-type regions 37 are formed inside of P-type guard ring 27.

FIG. 4B illustrates the diode thus obtained after deposition on insulating layer 29 of Schottky contact layer 31, in window 30 delimited by insulating layer 29, and of metallization 32 on the lower surface of substrate 20.

A diode of a specific type, known as a Schottky/bipolar diode, is thus obtained. Schottky contact region 31 is at places in contact with the lightly-doped N-type region 36 with which it forms a Schottky contact, and at places in contact with P-type regions 37 with which it forms an ohmic contact. As an example, the additional N regions 36 may be arranged in concentric rings equidistant from guard ring 27, or be distributed in checkered fashion or in parallel strips inside of guard ring 27. The distance between N and P regions 36, 37 is calculated as known in the art to increase the breakdown voltage and reduce the leakage current of the reverse-biased diode.

By modifying the patterns of masks 24, it is also possible to delimit one or several additional rings equidistant from guard ring 27 and arranged outside thereof. These external rings enable better control of the distribution of the equipotential surfaces at the periphery of the Schottky diode to improve its breakdown voltage characteristics. Such additional external rings may also be added to the Schottky diode structure of FIGS. 3A to 3E.

Figure 5A:
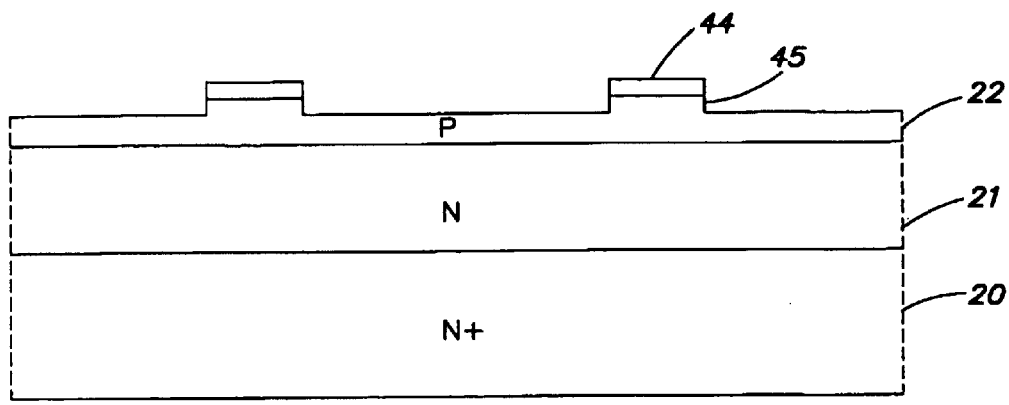
FIGS. 5A to 5C illustrate steps of the forming of another alternative Schottky diode on a silicon carbide substrate.
Figure 5B:
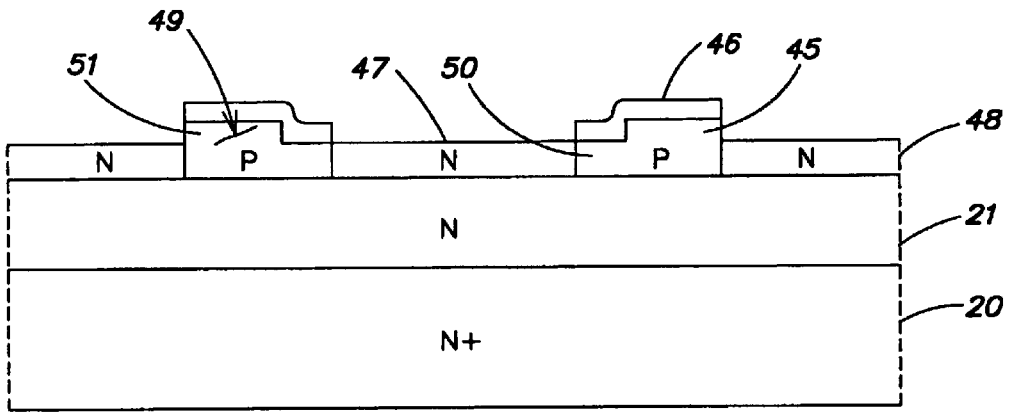
Figure 5C:
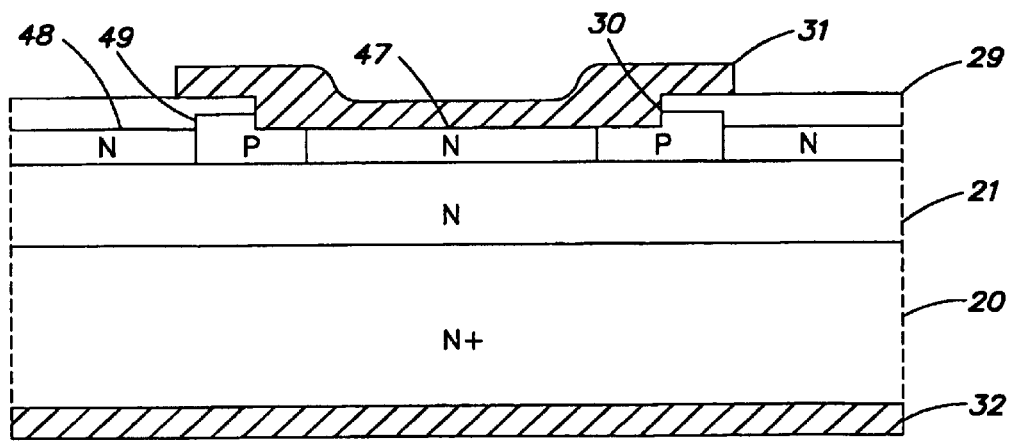

FIGS. 5A to 5C illustrate successive steps of a method for manufacturing an alternative Schottky diode.

FIG. 5A shows a step of the method preceding the step shown in FIG. 3B. A first mask 44 is formed on P-type epitaxial layer 22. Epitaxial layer 22 is then etched down to a depth smaller than the thickness of layer 22. P-type epitaxial layer regions of reduced thickness are thus obtained at the level of the areas unprotected by mask 44, and a protruding portion 45 is obtained at the level of the area protected by mask 44. The etch used is, for example, a dry anisotropic etch.

FIG. 5B shows the structure obtained once a second mask 46 has been deposited on the upper substrate surface and N-type dopants, for example, nitrogen, have been implanted, to form lightly-doped N-type regions. In particular, an active central region 47 and a peripheral N-type region 48 are formed outside of a P-type guard ring 49. Guard ring 49 comprises a first inner portion 50 of small thickness corresponding to a previously-etched area of epitaxial layer 22 and an external portion 51 of greater thickness comprising protruding portion 45.

FIG. 5C shows the Schottky diode obtained after deposition of insulating layer 29, the deposition of Schottky contact layer 31 in window 30 delimited in insulating layer 29, and the deposition of a metallization 32 on the lower surface of substrate 20. Insulating layer 29 covers the protruding portion 45 of guard ring 49 and substantially extends to protruding portion 45.

More generally, by modifying the patterns of the second mask, it is possible to etch the P-type epitaxial layer to obtain a P-type layer of reduced thickness comprising protruding P-type portions. If no N dopant implantation is performed in the protruding portions, P-type regions of uniform large thickness, or possibly stepped, are finally obtained. If N dopants are implanted in the protruding portions across the entire thickness of the P-type epitaxial layer, N-type regions of uniform large thickness or stepped may possibly be formed. Finally, if N dopants are implanted in the protruding portions down to a depth smaller than the thickness of the epitaxial layer, N-type regions located on P-type regions can be obtained.

As an example, a combination of the different previously-described alternatives may be considered. For example, a Schottky/bipolar diode, that is, a diode comprising P-type regions located inside of the guard ring and further surrounded with P- or N-type protruding rings may be obtained.

The present invention has many advantages.

It enables forming a Schottky diode in an N-doped silicon carbide substrate which comprises a P-type guard ring for a better breakdown voltage. It further enables simple forming of a Schottky/bipolar diode.

The possibility of etching the P-type epitaxial layer enables accurate control of its thickness. It may be advantageous to reduce the thickness of the P-type epitaxial layer to ease the layer inversion upon implantation of N dopants.

In the case where peripheral rings surrounding the guard ring are formed, the amount of charge carriers in the peripheral rings can be modified by the etching of the P-type epitaxial layer.

In a silicon carbide structure, the implantations occur across small thicknesses, and there is no diffusion until very high temperatures are reached. This enables accurately anticipating the obtained doping profiles. By successive implantations, with determined powers and doses, it is possible to obtain constant doping profiles. It is easier to compensate for an epitaxial layer formed in a silicon carbide structure and to obtain lightly-doped regions than in a silicon structure.

The present invention enables forming in a simple manner, at the same time as a Schottky diode, other structures that may take part in the forming of bipolar or MOS transistors, or diodes.

Of course, the present invention is likely to have various alterations, modifications, and improvements which will readily occur to those skilled in the art, in particular as relates to the dimensions of the various layers, vertically as well as horizontally.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a vertical Schottky diode with a guard ring on a lightly-doped N-type silicon carbide layer, comprising the steps of:
    forming a P-type epitaxial layer on the N-type layer;
    implanting N-type dopants in areas of the P-type epitaxial layer to neutralize P-type dopants in these areas, across an entire thickness of the epitaxial layer, to form N-type regions of dopant concentration lower than that of the epitaxial layer, the N-type regions delimiting a P-type guard ring;
    forming on an external periphery of the epitaxial layer an insulating layer partially covering the guard ring; and
    forming a Schottky contact with at least one of the N-type regions internal to the guard ring.

2. The method of claim 1, wherein additional P-type regions located inside of the guard ring are delimited upon implantation of N-type dopants.

3. The component of claim 1, wherein at least one additional ring located outside of the guard ring is delimited upon implantation of N dopants.

4. The method of claim 1, further comprising the step of etching, prior to the implantation of N dopants, areas of the P-type epitaxial layer down to a depth smaller than the thickness of said epitaxial layer to form P-type protruding portions.

5. The method of claim 4, wherein the guard ring is delimited to comprise a protruding portion located on its outer periphery.

6. The method of claim 5, wherein the insulating layer covers the protruding portion of the guard ring.

7. The method of claim 4, wherein N-type dopants are implanted in a protruding portion of the P-type epitaxial layer down to a depth smaller than the thickness of said portion to form N-type regions located on P-type regions.

8. A method of manufacturing a diode on an N-type silicon carbide layer, comprising acts of:
    (A) forming a P-type epitaxial layer on the N-type layer;
    (B) implanting N-type dopants in the epitaxial layer to form a plurality of N-type regions delimiting a P-type guard ring; and
    (C) forming a Schottky contact that contacts at least one of the N-type regions within an area delimited by the guard ring.

9. The method of claim 8, wherein acts (A)–(C) are performed such that the diode is a Schottky diode.

10. The method of claim 8, wherein acts (A)–(C) are performed such that the diode is a Schottky/bipolar diode.

11. The method of claim 8, further comprising an act of:
    (D) forming on a periphery of a surface of the epitaxial layer an insulating layer that partially covers the guard ring, such that the Schottky contact only contacts a portion of the guard ring not partially covered by the insulating layer.

12. The method of claim 8, wherein the act (A) comprises forming the epitaxial layer such that the epitaxial layer is more heavily-doped than the N-type layer.

13. The method of claim 8, wherein the act (B) comprises forming the N-type regions such that the N-type regions are less heavily-doped than the guard ring.

14. The method of claim 8, wherein the act (B) comprises forming the N-type regions such that at least two of the N-type regions delimit additional P-type regions within the area delimited by the guard ring.

15. The method of claim 8, wherein the act (B) comprises forming the N-type regions such that at least two of the N-type regions delimit at least one additional P-type ring external to the area delimited by the guard ring.

16. The method of claim 8, further comprising an act of:
    (D) prior to performing act (B), etching at least one area of the epitaxial layer to reduce a distance that the at least one area extends perpendicularly from a surface of the N-type layer, such that at least one portion of the epitaxial layer extends further, perpendicularly, from the surface of the N-type layer than the at least one area.

17. The method of claim 8, where the act (B) comprises forming the N-type regions such that the guard ring comprises the at least one portion.

18. The method of claim 8, further comprising an act of:
    (D) prior to performing act (B), forming a mask on the epitaxial region defining lateral dimensions of the N-type regions and the guard ring.

* * * * *